United States Patent [19]

Polata

[11] 4,018,627
[45] Apr. 19, 1977

[54] METHOD FOR FABRICATING SEMICONDUCTOR DEVICES UTILIZING OXIDE PROTECTIVE LAYER

[75] Inventor: Bohumil Polata, Los Altos, Calif.

[73] Assignee: Signetics Corporation, Sunnyvale, Calif.

[22] Filed: Sept. 22, 1975

[21] Appl. No.: 615,483

[52] U.S. Cl. .............................. 148/1.5; 148/175;
   148/187; 156/659; 357/91
[51] Int. Cl.² ................. H01L 21/265; H01L 21/31
[58] Field of Search .................. 148/1.5, 175, 187;
   156/11, 17, 3; 357/91

[56] References Cited

UNITED STATES PATENTS

| | | | |
|---|---|---|---|
| 3,542,551 | 11/1970 | Rice ............................... | 156/17 X |
| 3,551,221 | 12/1970 | Yanagawa ...................... | 148/175 |
| 3,560,278 | 2/1971 | Sanera ........................... | 148/187 |
| 3,793,088 | 2/1974 | Eckton .......................... | 148/1.5 |
| 3,920,483 | 11/1975 | Johnson et al. ............... | 148/1.5 |
| 3,925,105 | 12/1975 | Sloan ............................. | 148/1.5 |
| 3,928,081 | 12/1975 | Marley et al. ................. | 148/1.5 |
| 3,928,082 | 12/1975 | Schwettmann et al. ....... | 148/1.5 |
| 3,933,528 | 1/1976 | Sloan ............................. | 357/91 X |

OTHER PUBLICATIONS

Irving, S. M., "Plasma Oxidation . . . Photo Resist Films", Solid State Technology, June 1971, pp. 47–51.
Berger et al., "Masking Process for Base and Isolation Diffusion", I.B.M. Tech. Discl. Bull., vol. 14, No. 5, Oct. 1971, pp. 1612–1613.

Primary Examiner—R. Dean
Assistant Examiner—W. G. Saba
Attorney, Agent, or Firm—C. Richard Pfeiffer; William H. Dana

[57] ABSTRACT

Defect formations and unwanted in diffusions caused by residual impurity products is prevented in a semiconductor fabrication method which includes the step of forming a composite mask which simultaneously defines base, collector and diffusion isolation openings. After these openings are defined a thin protective layer of silicon dioxide is grown over the exposed area and remains there throughout the remainder of the doping process which includes the steps of selectively covering areas which are not to be doped with photoresist and thereafter ashering the photoresist to remove it in preparation for the next ion implantation step. The thin protective layer of silicon dioxide protects nonselected areas against residual impurity products formed during removal of the photoresist.

2 Claims, 8 Drawing Figures

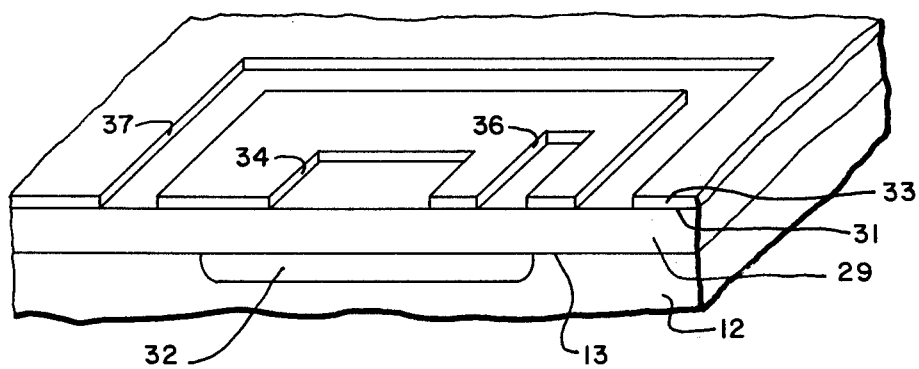
FIG.—1
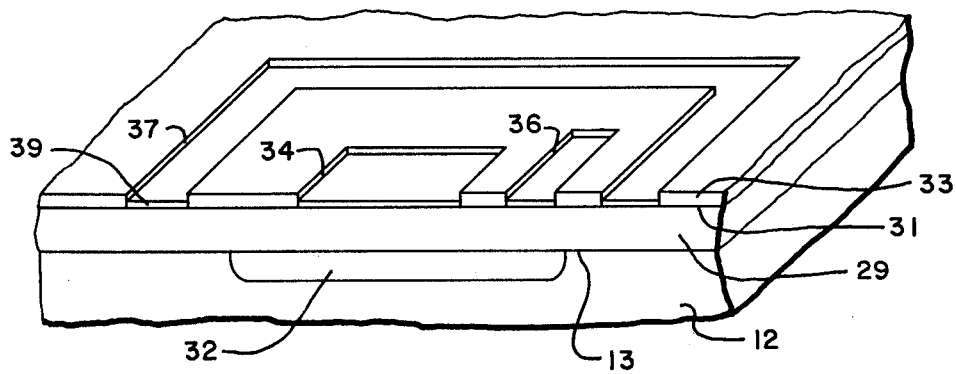
FIG.—2
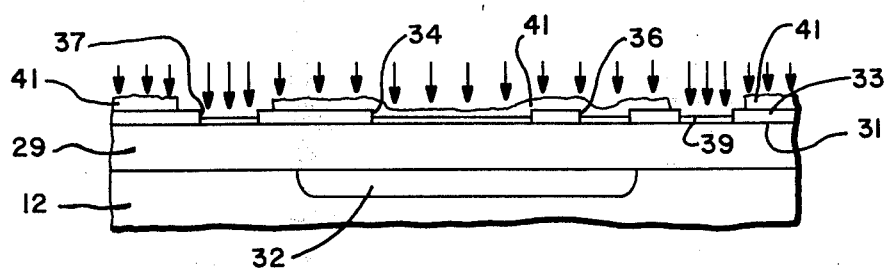
FIG.—3
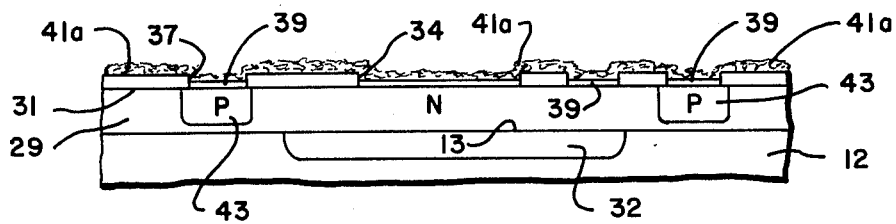
FIG.—4

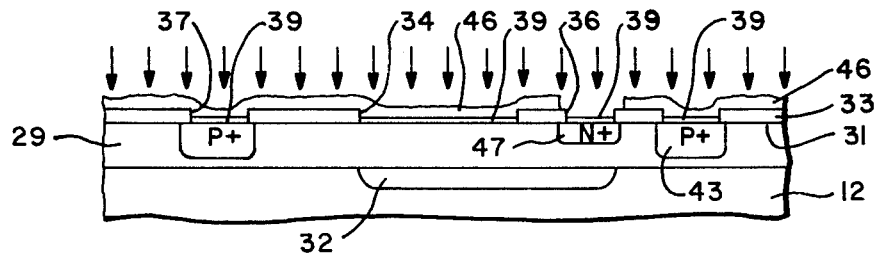
FIG.—5
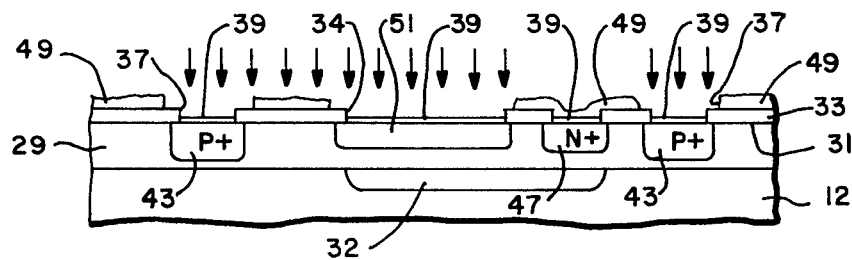
FIG.—6
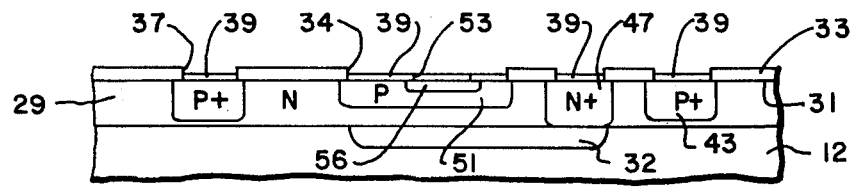
FIG.—7
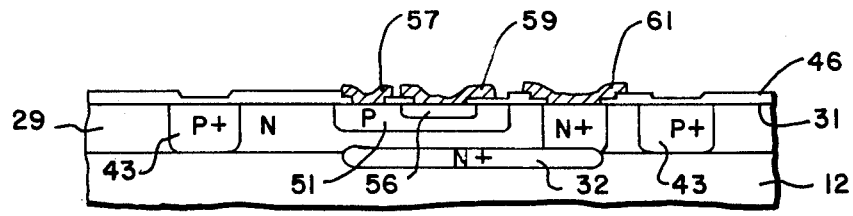
FIG.—8

METHOD FOR FABRICATING SEMICONDUCTOR DEVICES UTILIZING OXIDE PROTECTIVE LAYER

BACKGROUND OF THE INVENTION

This invention relates to a method for fabricating semiconductor devices specifically a low defect device in which the deleterious effects of residual impurity products are eliminated.

In a copending application entitled "Method For Fabricating Semiconductor Devices Using Composite Mask and Ion Implanation", Ser. No. 409,903, filed Oct. 26, 1973, and now U.S. Pat. No. 3,928,081 a method is disclosed where by using an initial composite mask, misalignment tolerances can be eliminated to permit fabrication of devices having a smaller geometry. The copending application dopes the various openings exposed by the composite mask by selectively covering these openings with either a photoresist or some metal such as aluminum; in other words, a material is easily removed. In some cases utilizing the foregoing technique semiconductor body contamination may be introduced producing defect regions; for example regions where unwanted materials might be diffused inwardly.

OBJECT AND SUMMARY OF THE INVENTION

It is a general object of the present invention to provide an improved method for fabricating semiconductor devices with low defects.

Accordingly there is provided a method for fabricating semiconductor devices from a semiconductor body having a planar surface. A layer of material is formed to be utilized as a mask on the surface. A plurality of openings are formed in the layer of material to expose areas of the surface. Thereafter, a thin protective layer is grown relative to the mask over each of the exposed areas. Thereafter, the areas defined by the openings are selectively doped by ion implantation and selectively covered so that areas exposed are not doped until the proper time in the sequence. The protective layer protects non-selected areas from residual impurity products formed during removal of the selective covering.

BRIEF DESCRIPTION OF THE DRAWINGS

FIGS. 1 through 8 are cross-sectional views, some of which are isometric, showing the steps utilized in the method incorporating the present invention.

DETAILED DESCRIPTION OF THE PREFERRED EMBODIMENT

As disclosed in the above copending application a semiconductor body, for example, of P-type impurity 12 is provided which has a planar surface 13. Buried layer 32 is provided by ion implantation as disclosed in the above copending application and thereafter an epitaxial N-type layer 29 is grown over layer 12. A layer 33 of silicon dioxide of a suitable thickness as, for example, one micron or 10,000 angstroms is grown on the surface 31 of epitaxial layer 29.

Next plural apertures 34, 36 and 37 are formed in layer 33 and are positioned as desired to provide respective masks for base, collector contact or plug, and diffusion isolation regions. Thus in a single or "master" mask step the interrelationship of the respective regions has been determined, and the conventional buildup of mask tolerances of separate masks has been eliminated.

In the above copending application the next processing step was the formation of a protective material such as a metal or photoresist covering the upper surfaces of the FIG. 1 structure overlying layer 33 and extending to cover windows 34, 36 and 37. By an additional noncritical photolithographic step, selected portions of the layer were then removed to expose selected windows or apertures such as the isolation aperture 37. Thereafter, the photoresist mask was removed back from the edges of aperture 37 to provide approximately 3 microns of tolerance from the edge. Thus the critical or defining mask edge of layer 33 remained. Then ion implantation was utilized to implant impurities, such as to form the isolation regions, wherein the composite combination of the photoresist masks and the mask 33 is sufficient to shield or stop the impurity ions in the nonexposed areas of the body.

It was found that while this unique combination of masks is advantageous, the ions absorbed and stopped within the photoresist layers (as opposed to a metal layer) can introduce subsequent defects when the photoresist layer is removed such as by an ashering or oxidation process. During this process the ions within the photoresist layer come into contact with the semiconductor surface when the photoresist layer is being reduced to a residue, thereby contaminating respective regions and introducing unwanted doping and defects in the final structure. As a result, the present invention provides an additional processing step shown in FIG. 2 wherein a relatively thin protective layer is formed on the surfaces exposed by apertures 34, 36 and 37. The relatively thin protective layer 39 formed to cover the exposed surface may be of silicon dioxide and need only be of sufficient thickness to prevent subsequent contamination and introduction of defects by the photoresist residue. In fact, the thickness of layer 39 need only be sufficient to provide a physical separation of the residue contaminants from the surface, and may be of the order of 0.1 microns. Layer 39 should be sufficiently thin that it may be readily removed such as by etching without deterioration of the mask edges of layer 33 which is being utilized to determine the peripheries of the respective regions.

Referring to FIG. 3, the next step is the formation of a photoresist or metal layer 41 on the upper surface of the composite structure. The layer 41, such as photoresist, may be conventionally photolithographically patterned to remove a portion of the layer and expose the region-defining masking edge of the underlying mask aperture 37. As previously discussed, layer 41 may be removed back from the mask defining edge to provide a tolerance of approximately 3 microns. Protective layer 39 continues to separate layer 41 from the epitaxial surface 29. Next the implantation may be carried out such as by providing an energy level of 150KeV directed at the entire upper surface of the FIG. 3 structure. The combination of layer 39 and layer 41 may be approximately 0.8 to 1 microns in thickness to be of sufficient magnitude to absorb and stop the impurity ions from the epitaxial layer in all but the previously exposed and predetermined regions. Layer 39 in the exposed regions is sufficiently thin to permit the passage of a substantial portion of the ions into layer 29 to form regions substantially defined by the mask edges of aperture 37.

Referring to FIG. 4, after the ion implantation step has been carried out the layer 41 is removed, such as by ashering or oxidation of the photoresist layer 41. As illustrated in a somewhat exaggerated format, a residue 41a is formed in the process of carrying out this step and were it not for the presence of protective layer 39 the residue would initially contact undesired portions of the surface 31 and thus introduce contamination and defects therein.

Thereafter, a diffusion step is carried out to diffuse inwardly the impurities which have been ion implanted. The protective layer 39 during the diffusion may increase slightly in thickness by virtue of oxidation during the diffusion step. A dry oxidation process is utilized with the structure being exposed in a dry atmosphere at a sufficient temperature for a suitable period of time to drive the implanted boron impurities downwardly to form P± regions 43 thereby defining a PN junction within said body and extending from surface 31. The diffusion depths of regions 43 are carefully controlled so that the regions almost extend to the upper surface 13 of substrate 12. The depth is predetermined such that when final processing is completed the regions 43 will extend all the way down to substrate 12 to provide isolated islands for the completed transistor devices. Again the use of ion implantation substantially reduces side diffusion over that normally encountered in complete thermal diffusion. The utilization of ion implantation as disclosed in the above copending application is advantageous in reducing the capacitive coupling in the circuit. Specifically it has been possible to reduce the tolerance required between the base region and the isolation regions in addition to the fact that mask-to-mask tolerances need no longer be accounted for since the first or master mask determines the region-to-region spacing and correspondingly circuit capacitance. For example, boron may be implanted to a depth of approximately one micron and then diffused to an additional depth of 2-3 microns with a side diffusion of approximately only two thirds of this additional depth.

Referring to FIG. 5, the next step is the formation of an additional masking layer 46, such as a photoresist, on the upper surface of the FIG. 4 structure. Utilizing conventional techniques, a portion of the layer is removed to expose aperture 36 and the portion of layer 39 overlying the surface 31 to be utilized as a collector contact or plug. Again a tolerance of approximately 3 microns clearance may be provided with layer 46 being removed back to expose the mask edge of aperture 36. Next the desired N type impurity such as phosphorous is implanted directly through layer 39 and defined by aperture 36 to form a N+ collector plug or contact region 47 within epitaxial layer 29 extending from surface 31. The composite combination of layer 46 and mask layer 33 serve to shield and stop ions from penetrating to surface 31 except for the surface portion defined by aperture 36 with a substantial portion of the ions easily penetrating the relatively thin protective layer 39. Implantation may be to a depth of approximately 0.3 to 0.8 microns.

Subsequently the later 46 is removed and the structure initially diffused in a slightly oxiding atmosphere and then continuing in a nonoxidizing atmosphere such as inert gas to drive the N impurities downwardly to form N± region 47 as shown in FIG. 6.

As is conventionally known the subsequent diffusion steps may be carried out at progressively lower temperatures to minimize the further out diffusion of previously formed regions. The diffusion steps may be carried out at the same or different temperature so long as the effect of the combined out diffusion of the respective regions at the respective temperatures for the corresponding exposure times are taken into account when determining the resultant total diffusion depth.

As previously disclosed in the above copending application, with thin epitaxial structures, such as a 1 ½ micron epitaxial layer, ion implantation may be utilized for penetrating almost all of the semiconductor structure with very little additional thermal driving being required. The effect is to significantly reduce lateral diffusion and correspondingly provide reduced tighter geometries suitable for higher density structures.

Referring to FIG. 6, the previous layer 46 may be removed and an additional layer 49 formed and patterned to expose only the aperture 34 and 37. Again a clearance at approximately 3 microns may be provided with layer 49 being moved back to expose the mask edges of apertures 34 and 37. Next a P-type implantation is performed in the upper surface of the FIG. 6 structure to form base region 51 defined by the edges of aperture 34 in mask 33. The further implantation of impurities in regions 43 further enhances the P+ isolation and may in addition help prevent inversion at the surface 31. This step may be carried out entirely by thermal diffusion if so desired. In such a case the protective layer 39 in apertures 34 and 37 is removed by etching to allow thermal deposition. The layer 33, although reduced still defines areas at thermal deposition.

Layer 49 is removed as shown in FIG. 7 and a predetermined portion of layer 39 is removed to form an aperture 53 exposing an area of surface 31 entirely within region 51. The aperture may be formed by conventional photolithographic techniques. N-type impurities are diffused through aperture 53 to form N region 56 entirely within region 51 and extending to surface 31. Although disclosed as being formed by thermal diffusion, region 56 may be formed by ion implantation provided that a sufficiently low energy level is utilized in combination with the thickness of layer 39 to provide protection for and shield the implantation of the impurities in all but the area to be exposed.

Referring to FIG. 8, apertures are formed in the layer 39 to expose portions of the respective regions in surface 31. A conventional metal layer, such as aluminum, is evaporated over the surface and the undesired metal portions removed by conventional techniques thereby providing contacts 57, 59 and 61. During the final diffusion steps the P+ regions 43 have been permitted to extend and contact the underlined substrate 12 and thus isolate the complete device.

Other PN structures may be simultaneously fabricated with the formation of the transistor herein described to provide diodes, diffused resistors and other devices which may be subsequently interconnected by the final patterned aluminum layer to provide an integrated circuit.

The present method of utilizing a protective layer, intermediate the photoresist masking layer and the surface of the epitaxial layer, provides significant improvements particularly in the formation of large buried layers underlying structures including 100 or more emitters. Previously known defects severely limited the size of such structures.

Thus, there has been provided a method for forming low defect regions in a semiconductor body providing an improved protective masking structure for utilization in forming a low defect, high yield region in a semiconductor structure.

What is claimed is:

1. A method for fabricating semiconductor devices from a semiconductor body having a planar surface comprising the steps of forming a layer of material to be utilized as a mask on said surface, forming a plurality of openings in the layer of material to expose areas of said surface, thereafter forming a thin protective layer, relative to said mask, over each of said exposed areas and maintaining said thin protective layer throughout the fabrication steps, and thereafter selectively doping the areas defined by said openings by ion implantation and selectively covering said openings so that areas exposed are not doped until the proper time in said sequence, said thin protective layer protecting nonselected areas from residual impurity products formed during removal of said selective covering.

2. A method as in claim 1 where said thin layer is silicon dioxide and where said selective covering is accomplished by use of a photoresist which is removed by ashering.

* * * * *